United States Patent
Graef et al.

(10) Patent No.: US 6,457,160 B1
(45) Date of Patent: Sep. 24, 2002

(54) ITERATIVE PREDICTION OF CIRCUIT DELAYS

(75) Inventors: Stefan Graef, Milpitas, CA (US); Floyd Kendrick, Gilroy, CA (US)

(73) Assignee: LSI Logic Corporation, Milpitas, CA (US)

(*) Notice: Subject to any disclaimer, the term of this patent is extended or adjusted under 35 U.S.C. 154(b) by 165 days.

(21) Appl. No.: 09/592,749

(22) Filed: Jun. 13, 2000

(51) Int. Cl.[7] .............................................. G06F 17/50
(52) U.S. Cl. .................... 716/6; 716/4; 716/5
(58) Field of Search ........................... 716/1–21; 703/1, 703/14, 15; 345/441, 763

(56) References Cited

U.S. PATENT DOCUMENTS 5,867,399 A * 2/1999 Rostoker et al. ............. 716/18

\* cited by examiner

Primary Examiner—Vuthe Siek
Assistant Examiner—Naum Levin
(74) Attorney, Agent, or Firm—Mitchell, Silberberg & Knupp, LLP

(57) ABSTRACT

Provided is a technique for circuit delay prediction in which blocks (preferably, non-overlapping blocks) are specified, each of the blocks including a portion of the circuit. Delay calculation collars (DCCs) are then defined for the blocks, the DCCs including complete dependency information required to calculate delay within the blocks. Next, delay is calculated for the blocks based on the DCCs and delay is calculated for the circuit based on the DCCs. The DCCs are then modified as necessary based on results of either or both of the delay calculation for the blocks or the circuit. The delay calculation and DCC modification steps are then repeated.

21 Claims, 3 Drawing Sheets

ITERATIVE PREDICTION OF CIRCUIT
DELAYS

BACKGROUND OF THE INVENTION

1. Field of the Invention

The present invention concerns circuit analysis, and particularly relates to circuit timing analysis, such as for use in designing and fabricating integrated circuits.

2. Description of the Related Art

An integrated circuit chip (hereafter referred to as an "IC" or a "chip") typically includes cells and connections between the cells formed on a surface of a semiconductor substrate. The IC may include a large number of cells and require complex interconnections between them.

A cell is a group of one or more circuit elements such as transistors, capacitors, and other basic circuit elements grouped to perform a function. An example of a cell is an AND or an OR gate. Each of the cells of an IC may have one or more pins, each of which, in turn, may be connected to one or more other pins of the IC by wires. The wires connecting the pins of the IC are also formed on the surface of the chip.

A net is a set of two or more pins which must be connected. Because a typical chip has many thousands or millions of pins which must be connected in various combinations, the chip also includes definitions of many thousands or millions of nets, or sets of pins. All the pins of a net must be connected. The number of the nets for a chip is typically on the same order as the order of the number of cells on that chip. Commonly, a majority of the nets include only two pins to be connected; however, many nets comprise three or more pins. Some nets may include hundreds of pins to be connected.

A netlist is a complete description of the circuit including cells, connectivity, and netnames.

Microelectronic integrated circuits consist of a large number of electronic components that are fabricated by layering several different materials on a silicon base or wafer. The design of an integrated circuit transforms a circuit description into a geometric description which is known as a layout. A layout consists of a set of planar geometric shapes in several layers.

The layout is then checked to ensure that it meets all of the design requirements. The result is a set of design files in a particular unambiguous representation known as an intermediate form that describes the layout. The design files are then converted into pattern generator files that are used to produce patterns called masks by an optical or electron beam pattern generator.

In the field of integrated circuit (IC) technology, one of the most important design considerations is the speed in which a particular IC design operates. During the design process, an IC design is analyzed multiple times for its timing characteristics, also called "delay" of the circuit. As IC designs grow increasingly large and complex, performing a delay analysis, or "delay prediction," may take many hours or days, even on very powerful computers. This is because these large IC designs use many components (such as gates) and because the interconnections between those components often are very complex.

Accordingly, what is needed is a technique for faster delay prediction of a design.

SUMMARY OF THE INVENTION

The present invention addresses the foregoing problem by providing an iterative technique in which blocks are specified, and then steps of block and circuit delay calculation based on delay calculation collars (DCCs) and modification of the DCCs based on the delay calculations are repeated.

Thus, the invention is directed to circuit delay prediction in which blocks (preferably, non-overlapping blocks) are specified, each of the blocks including a portion of the circuit. Delay calculation collars (DCCs) are then defined for the blocks, the DCCs including complete dependency information required to calculate delay within the blocks. Next, delay is calculated for the blocks based on the DCCs and delay is calculated for the circuit based on the DCCs. The DCCs are then modified as necessary based on results of either or both of the delay calculation for the blocks or the circuit. The delay calculation and DCC modification steps are then repeated.

By repetitively calculating delay based on DCCs and DCCs based on delay in the foregoing manner, the present invention typically can provide faster delay calculation than conventional techniques would permit. In particular, the foregoing iterative block segmentation allows delay calculation to be performed only for a number of relatively small blocks, which generally will be much faster than attempting to delay predict the entire circuit at once, even after taking the iterations into account.

The foregoing summary is intended merely to provide a brief description of the general nature of the invention. A more complete understanding of the invention can be obtained by referring to the claims and the following detailed description of the preferred embodiments in connection with the accompanying figures.

DESCRIPTION OF THE PREFERRED
EMBODIMENTS

Figure 1:
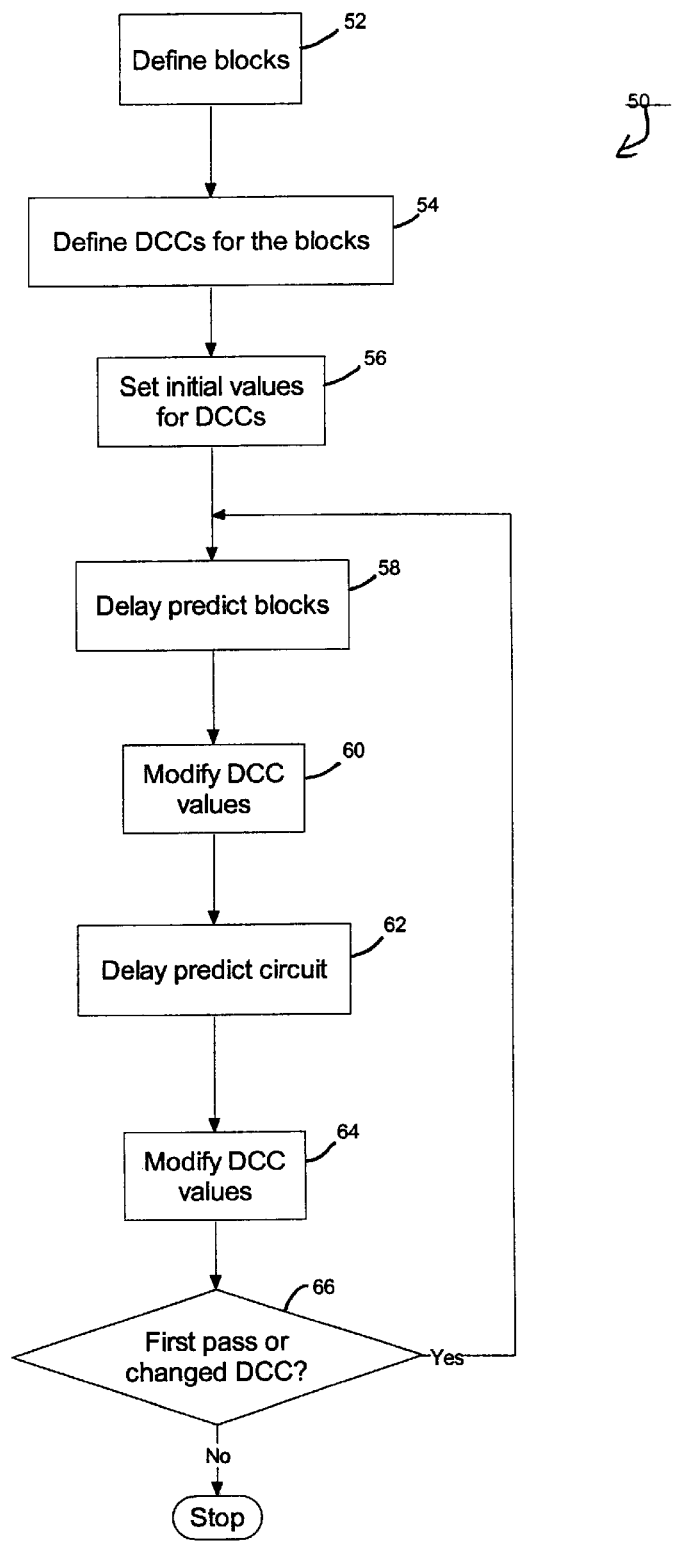
FIG. 1 illustrates a flow chart for explaining delay prediction according to a representative embodiment of the present invention.

Generally speaking, the present invention determines a delay prediction for an entire circuit by subdividing the circuit into blocks and then iteratively: (i) calculating delay for the individual blocks and for the circuit as a whole based on delay calculation collars; and (ii) modifying the DCCs based on the delay calculation. The flow chart 50, shown in FIG. 1, illustrates steps for performing delay prediction according to a representative embodiment of the present invention. The technique illustrated in flow chart 50 is discussed with reference to the sample circuit design illustrated in FIG. 2.

Defining Blocks, Step 52

Initially, in step 52 the entire circuit is divided into blocks which will be separately analyzed. Preferably, these blocks are non-overlapping, representing distinct portions of the circuit. If the entire circuit is considered to be a block, then partitioning of the entire circuit into blocks results in a two-level block hierarchy, with the block consisting of the entire circuit being the higher level and the sub-blocks being the lower level. Even further levels of hierarchy may be defined, with each block above the bottom level being divided into multiple sub-blocks. The methods discussed below are directly applicable to a hierarchy having any number of levels. However, for simplicity sake the following discussion generally will assume only a two-level hierarchy.

It is also noted that not every portion of any given block (including the block corresponding to the entire circuit) to be subdivided is required to belong to a sub-block within that block. For example, the entire circuit may include a number of blocks and also certain gates or buffers that are not associated with any block.

The blocks and their sub-blocks may be defined arbitrarily. However, in most cases the blocks and sub-blocks will be defined based on standard functional groupings of cells and/or other elements. Typically, the various blocks will be designed separately and then later combined to form the entire circuit. As indicated above, once the various blocks have been designed and are ready to be combined, it may be necessary to introduce additional gates and/or buffers, not associated with any block, in order to properly route signals between the blocks. For example, additional buffers may be desirable when routing a signal from one block to another block that is a significant distance away.

In order to increase the speed at which the present technique converges to a solution, to the extent that there are any combinational loops within the circuit, it is preferable that each such loop be enclosed within a single block. Also to maximize speed of convergence, it is also preferable that each block be limited to a size of approximately 200,000 to 500,000 gates. Accommodating both of the foregoing goals may require engineering tradeoffs.

In the preferred embodiment, the entire circuit includes various blocks. However, those blocks are not further subdivided into lower-level blocks, meaning that only a two-level hierarchy is employed. Thus, referring to FIG. 2, circuit 100 includes blocks 102 and 104 which, in turn, include various gates, buffers and flip-flops, but no sub-blocks. Circuit 100 also includes gates 106, 108 and 110 which are not part of any block.

Defining Delay Calculation Collars, Step 54

In step 54, delay calculation collars (DCCs) are defined for the blocks identified in step 52. Generally speaking, the DCCs include complete dependency information required to calculate delay within the blocks. Preferably, the DCCs consist only of a set of minimal dependency information required to calculate delay within the blocks. However, non-essential information may also be included in the DCCs. In the preferred embodiment, the DCCs also contain sufficient information to calculate overall delay of the circuit as a whole (i.e., the top level of the hierarchy). More preferably, rather than containing complete information regarding each block, the DCCs contain a much smaller amount of information from each block required to calculate delay for the blocks at the current level of the hierarchy, as well as for the block at the next higher level of the hierarchy.

With regard to the foregoing, it is initially noted that delay of a block generally will depend upon certain characteristics of components and other blocks that are connected to the first block and upon the characteristics of the boundary nets for the block. A boundary net is defined as a net which crosses the boundary of a block. In more detail, the delay of a block generally will depend upon circuitry and wiring connected to the block's input terminals and upon circuitry and wiring connected to the block's output terminals. On the input side, the required information typically includes topology information (such as resistance-capacitance (RC) information) for all boundary nets that connect to input pins of the block (but only those portions of such boundary nets that are outside of the subject block), identification of all gates driving such boundary nets, and ramp times of all signals input into such gates. On the output side, the required information typically includes topology information for all boundary nets that connect to output pins of the block (but only those portions of such boundary nets that are outside of the subject block), and identification of all gates loading such boundary nets (particularly, gate input information such as input pin capacitance).

Based on these considerations, two types of DCCs preferably are defined for each block. An outside DCC includes complete information regarding circuitry and wiring outside of the subject block that is required to calculate delay within the subject block, preferably a minimal set of such information. An inside DCC includes complete information about the subject block that is required to calculate delay for other portions of the circuit that are connected to the subject block, preferably a minimal set of such information. In essence, the inside DCC for a block allows the block to be abstracted, thereby allowing delay calculation for other portions of the circuit without having to store and process circuitry and wiring information for the entire block.

Thus, the outside DCC preferably consists of: (i) on the input side, resistance-capacitance (RC) topology information for all boundary nets that connect to input pins of the block (but only those portions of such boundary nets that are outside of the subject block), identification of all gates driving such boundary nets, and ramp times of all signals input into such gates; and (ii) on the output side, topology information for all boundary nets that connect to output pins of the block (but only those portions of such boundary nets that are outside of the subject block), and identification of all gates loading such boundary nets (particularly, gate input pin parasitic information such as input pin capacitance).

The inside DCC preferably consists of: (i) on the input side, resistance-capacitance (RC) topology information for all boundary nets that connect to input pins of the block (but only those portions of such boundary nets that are inside of the subject block), and identification of all gates loading such boundary nets (particularly, gate input information such as input pin capacitance), and ramp times of all signals input to such gates; and (ii) on the output side, topology information for all boundary nets that connect to output pins of the block (but only those portions of such boundary nets that are inside of the subject block), identification of all gates driving such boundary nets, and ramp times of all signals input into such gates.

Figure 2:
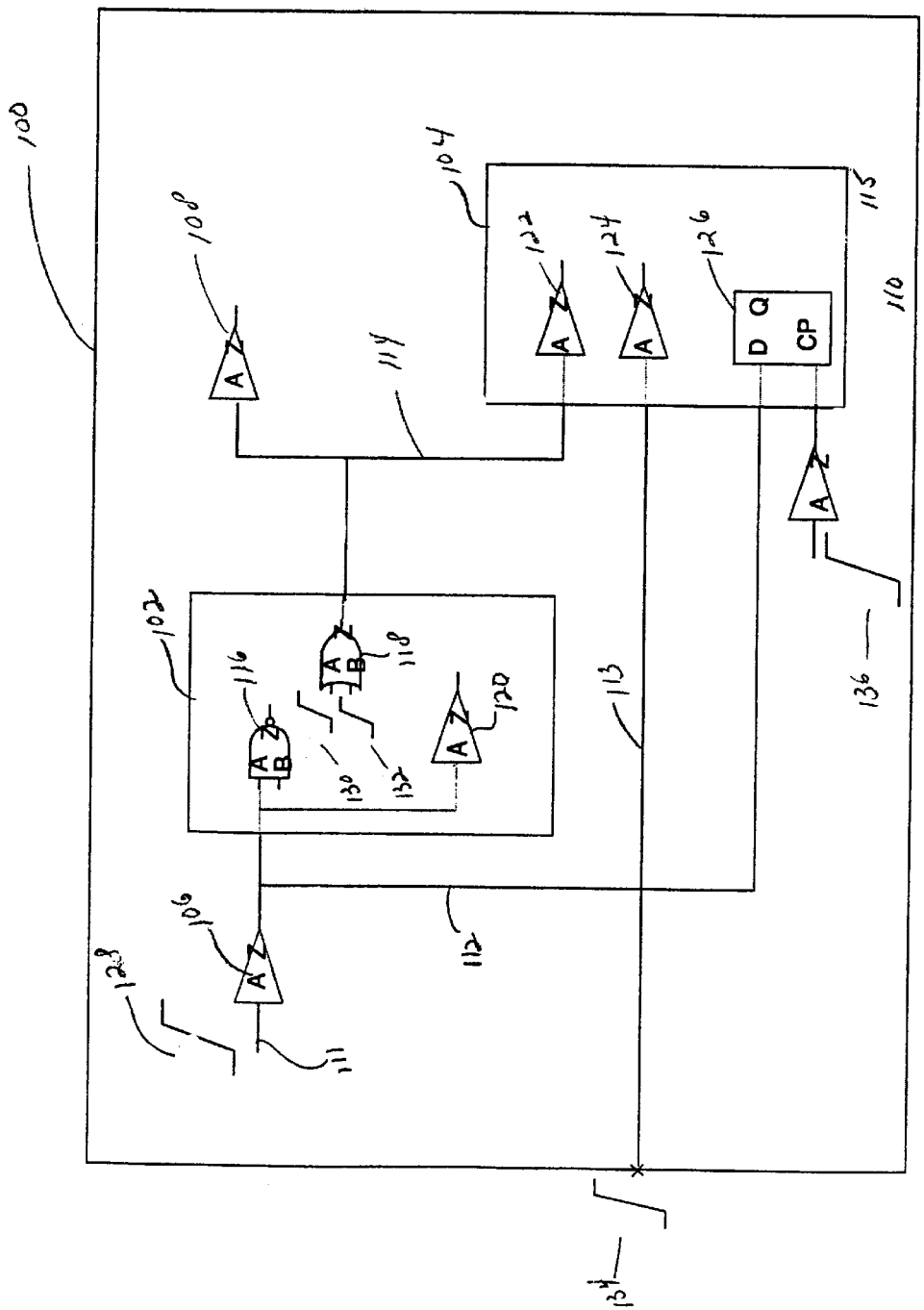
FIG. 2 is a representative circuit diagram used to illustrate application of the techniques of the present invention.

It is noted that the foregoing definitions for inside DCC and outside DCC apply to blocks on the same hierarchical level (e.g., blocks 102 and 104 in FIG. 2), and the inside DCCs defined in this manner can also be used to delay predict the block at the next higher level (e.g., block 100 in FIG. 2). For purposes of consistency, we may also define a top-inside DCC as the information for such next higher level block (e.g., block 100 in FIG. 2) that is required to delay predict the current level blocks (e.g., blocks 102 and 104 in FIG. 2). In this case, the top-inside DCC for such next higher level block could consist of all wiring and circuitry information that is included within such next higher level block but not within any sub-block that is included within such next higher level block. Stated somewhat differently, the top-inside DCC would include information required to delay predict the blocks at the current level for all wiring and circuitry that is not associated with any block at the current level. However, particularly where there is a significant amount of such circuitry and/or wiring that is not included in any such sub-block, it may instead be preferable to define the top-inside DCC as only the minimum information regarding such next higher level block that is required to delay predict each included sub-block (i.e., only that information that is included in the sub-block's outside DCCs). In this case, the outside DCCs for the blocks at the current level can be fully specified using information from the inside DCCs for the blocks at the current level and the top-inside DCC for the block at the next higher level. If more than two levels of hierarchy are to be used, it also will be preferable to define an inside DCC for such next higher level block for purposes of delay predicting other blocks at its level, as well as for delay predicting the block immediately above its level.

Using the foregoing definitions, it can readily be seen that the delay for any given block can be calculated with, for example, the following information (the DCC files):

- a netlist that includes block definitions and boundary cells and boundary nets for the blocks;
- Standard Parasitic Extraction File (SPEF) and Segment Length (SEGLEN) files consisting of parasitics of all boundary nets;
- ramp times of all input pins of driver cells driving boundary nets;
- block receiver list; and
- block source list.

Ramp time is a measure of the transition time for a signal at a pin to go from logic 0 to logic 1 or from logic 1 to logic 0.

Parasitics of a net are combination values derived from the resistance, inductance, and capacitance of the net itself with environmental conditions affecting the net.

Input pin capacitance of a gate is the capacitance at an input pin of the gate.

Boundary cells are those cells having input or output pins belonging to a boundary net. For example, in FIG. 2, the boundary cells for block 102 are gates 106, 116, 118, 120, 108 and 122.

Driver cells are cells, or gates, which provide an input signal to a block. In the example of FIG. 2, cell 106 is the only driver cell for block 102. The driver cell 106 has input pin A and output pin Z. The input pin A of the driver cell 106 belongs to net 111 and has ramp time 128.

Block receiver list (BRL) is a list of other blocks that the block (currently being analyzed) is dependent upon for DCC information. For example, in FIG. 2, the BRL for block 102 consists of blocks 104 and 100, block 100 being the entire circuit.

Block source list (BSL) is a list of blocks which depend upon the block (currently being analyzed) for DCC information. For example, in FIG. 2 the BSL for block 102 includes blocks 104 and block 100.

Referring to FIG. 2, the inside DCC for block 102 consists of: gates 120, 116 and 118; block 102-level parasitics of nets 112 and 114 (i.e., those portions of such nets that are enclosed with block 102); and ramp times 130 and 132. The outside DCC for block 102 consists of: (i) block 100-level parasitics for net 112 (i.e., those portions of net 112 within block 100 but outside of any block within block 100); (ii) buffer 106; (iii) input signal ramp time 128; (iv) block 100-level parasitics for net 114; (v) input pin capacitance for gate 108; (vi) block 104-level parasitics for net 114; and (vii) input pin capacitance for gate 122. It is noted that items (i) through (v) are included within the top-inside DCC for block 100 and items (vi) and (vii) are included within the inside DCC for block 104. Thus, the BRL for block 102 consists of blocks 104 and 100. The BSL for block 102 also consists of blocks 104 and 100.

Obtaining Initial Values/Assigning Default Values, Step 56

Ideally, the value of each of the DCC elements is available. However, in practice, many of the DCC element values may not be available, at least initially. For example, in the first instance it is unlikely that many signal ramp times will be known with certainty. Thus, in this step default values are assigned for the elements whose values are not available. The default values may be determined based on experience obtained during previous analysis, the current circuit analysis, a best guess of the designer, or any combination of these. In addition, the default values may represent expected worst case values, the most likely expected values, or any combination of these. Generally, the technique described herein will converge to appropriate timing values regardless of the initial default values specified for unknown parameters, although the time required for such convergence may vary depending on how such default values are specified.

Preferably, a default value is specified for a DCC parameter only if no other information is available for that parameter, with either known values or previous estimates being used for all other parameters. In other words, in each case it is preferable to use the best available information for each parameter. Thus, if a particular block's outside DCC netlist is defined but ramp times and parasitics are unavailable, then the outside DCC for the block will consist of the known DCC netlist together with default ramp times and parasitics. In later steps of the process, the DCCs are refined by updating their component parts.

Block Delay Prediction, Step 58

Using the DCC information, and in particular the outside DCC, for a particular block, combined with a complete block level layout of that block, a delay prediction is made for each block. Various methods for delay predicting a block of circuitry are well known and will not be discussed in detail here. For the purposes of the present invention, the AWE (asymptotic waveform evaluation) method may be used to predict the delay of the individual blocks. Thus, in this step delay is predicted for each block of the circuit using only information internal to the block together with the block's outside DCC. By holding the outside DCC information constant during this step of the process, the blocks may be delay predicted in parallel, thereby further reducing the time required for delay prediction.

Also, it generally will not be required to delay predict any block that has an outside DCC whose values have not changed from the immediately previous time (if any) that this step was executed. Thus, identifying those blocks whose outside DCCs have not changed can further reduce processing time.

As noted above, all information required to delay predict any particular block is defined by the block's outside DCC. Moreover, in the preferred embodiment of the invention, this information is captured in the DCC files. For example, using the SPEF and SEGLEN files the parasitics of that portion of the boundary nets connected to the subject block's input terminals can be determined. Similarly, using the netlist and the BRL, the gates driving those boundary nets (whether or not enclosed within a block) can be identified. In the preferred embodiment of the invention, the delay results for each of the blocks are written out in the standard delay format (SDF) files.

Modifying Values for DCCs, Step 60

As a byproduct of delay prediction in step 58, new values may be determined for various circuit parameters within each block. For example, the delay prediction may have provided new estimates of certain ramp times. In step 60, these new parameter values are used to update the DCCs. Optionally, this step 60 can be omitted and all DCC parameter values updated only in step 64 (described below).

Circuit Delay Prediction, Step 62

In step 62, the delay for the entire circuit is predicted using any known technique for delay prediction, such as AWE. However, rather than using complete information for the entire circuit, this step uses the inside DCCs for the blocks that are included in the circuit, thereby typically significantly reducing the amount of processing required.

Modifying Values for DCCs, Step 64

As a byproduct of delay prediction in step 62, new values may be determined for various circuit parameters at the top level block. In step 64, these new parameter values are used to update the DCCs. In particular, the top-inside DCC parameter values may be updated. Similarly, if more than two levels of hierarchy are being used, the inside DCC for this higher level block also may be updated.

Determining Whether to Repeat the Loop, Step 66

In step 66, it is determined whether the first pass has just been completed or, if this is the end of the second or later pass, whether any DCC parameter value has changed from the immediately preceding pass. If the answer to either question is "yes", then processing returns to step 58. Otherwise, the circuit delay calculated in the last iteration of step 62 is the final delay prediction for the circuit, and processing is completed.

By repetitively calculating delay based on DCCs and modifying DCCs based on the delay calculations, the present invention permits delay prediction of much smaller portions of a circuit than conventional techniques generally would allow. As a result, delay calculation often can be performed in significantly less time.

Additional Embodiments and other Considerations

As noted above, delay prediction in the above technique may be performed in parallel for the various blocks. Specifically, an IC design may be defined to include a number of blocks where the blocks may be referred to as $B_1$, ... $B_n$ and where n is the number of blocks in which the IC is defined to include. To delay predict an IC having n blocks, a computing system having a multiple number of processors may be used to process the blocks in parallel, each processor taking one or more blocks to analyze. However, even though all blocks can be delay-predicted in parallel (given the inside DCCs of its dependent blocks), this may not always be beneficial due to the existence of combinational dependencies and loops.

It is also noted that in certain circumstandes the method described above may not be bounded, meaning that the number of iterations to be done before accomplishing delay prediction of the entire design may be unknown. The number of iterations generally will increase if there are: inter-block combinational dependencies; or inter-block combinational or latch-based loops. However, if all the blocks register their inputs and outputs, then the process generally converges in a maximum of two passes, because none of the blocks is dependent on other blocks, due to the fact that in flip-flops there are no propagation timing arcs from the D-input pin. All delay dependencies in that case would be from the CP pin (clock), which usually connects to a global net.

The above process generally will be better behaved if global nets such as clock nets are completed before embarking on block level delay prediction. This is done because updating global nets later in the delay prediction cycle may require many blocks to be re-delay predicted, thus increasing runtimes and prolonging convergence.

Following the completion of the delay prediction for each of the blocks and the entire circuit, the SDF of each of the blocks can be merged into a single SDF file in ASCII or "flat" format suitable for viewing and analysis by the designers.

The delay prediction for an IC should be re-run for a block when any one of the following takes place:

a structural change was done to the block (i.e that block's netlist changed);

routing inside the block was modified (i.e the block's SPEF file changed); or the inside DCC for any of the block's dependent blocks has changed.

Inter-block combinational dependencies of a particular block are stored as part of the DCC specification (as described above). However, a chain of dependencies might degrade performance, as the following problem illustrates. Consider, for example, that Block B3 depends on block B2 which depends on block B1 (combinational dependency). Now let us say that there were changes made to Block B1 and Block B2 and therefore the inside DCCs of both Block B1 and B2 were updated. Due to these updates, blocks B2 and B3 need to be re-delay predicted. However, it generally will not be advisable to delay predict both blocks in parallel, even though it is technically possible, because re-delay-prediction of Block B2 might further change the inside DCC of block B2, thus warranting re-delay-prediction of block B3. Thus, in this case, it is better to first wait for block B2 to be re-delay predicted and then re-delay predict block B3.

This sequence of re-delay prediction of blocks with dependencies can be automated if we maintain a Global Block Dependency List (GBDL). This list is essentially a directed graph of all blocks in the design. The list can be derived from each block's BRL and BSL. Knowing the global dependencies, we can schedule redelay prediction of blocks optimally such that redundant re-delay predictions can be avoided.

Presence of inter-block loops degrades performance because changes in any block in the loop may require re-delay prediction of the all the blocks in the loop several times (until convergence is reached). There are several techniques to approach this problem, such as:

Instead of depending on user-defined blocks, create a partitioning engine which will partition the design based on the needs of hierarchical delay prediction (i.e., no inter-block loops should exist).

Recognize inter-block loops and combine these blocks to form super-blocks until there are no inter-block loops.

Live with the performance degradation if there are not too many inter-block loops.

In real designs, inter-block loops not only will cause delay prediction problems but also will cause problems with time budgeting and block management. As such, good designs should not contain inter-block combinational loops.

Boundary nets pose a problem when printing out SDF. The problem is to determine where the interconnect delay should be printed if the net spans two or more blocks. One method would be to print the interconnect delay as port delay in all the receiver pins. However, with this approach the block level SDF which contains the driver of the net will not have any interconnect delay and therefore path analysis of paths which include this net will result in optimistic delays. Another method is to kludge the interconnect delay by adding it as cell delay of the driving cell (as one cannot have a delay from a pin to a port in SDF). In this case, the blocks which contain the receiver pins (driven pins) will not have any delay between that block's port and pin. A third method is to combine the above two approaches by distributing the interconnect delay between all the blocks involved. A fourth method is to produce SDF files not per block but per block including the outside DCC gates. This way, there will be no loss of accuracy when the netlist of the block is used in conjunction with the SDF.

Design System Environment

Figure 3:
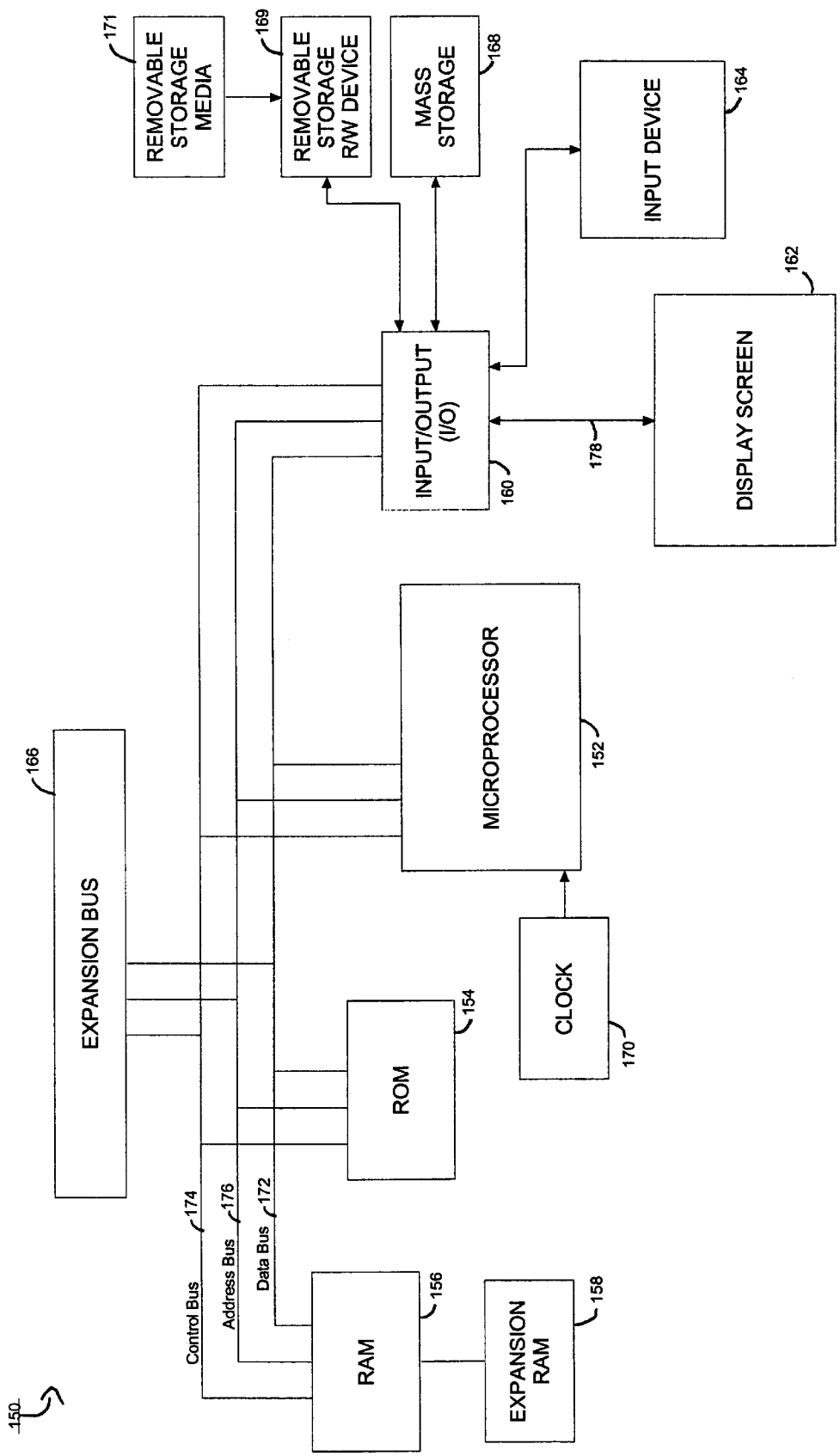
FIG. 3 is a block diagram of a general-purpose computer system, representing one suitable computer platform for implementing the methods of the present invention.

Generally, the methods described herein with respect to IC design will be practiced with a general purpose computer, either with a single processor or multiple processors. FIG. 3 is a block diagram of a general purpose computer system, representing one of many suitable computer platforms for implementing the methods described above. FIG. 3 shows a general purpose computer system 150 in accordance with the present invention. As shown in FIG. 3, computer system 150 includes a central processing unit (CPU) 152, read-only memory (ROM) 154, random access memory (RAM) 156, expansion RAM 158, input/output (I/O) circuitry 160, display assembly 162, input device 164, and expansion bus 166. Computer system 150 may also optionally include a mass storage unit 168 such as a disk drive unit or nonvolatile memory such as flash memory and a real-time clock 170.

CPU 152 is coupled to ROM 154 by a data bus 172, control bus 174, and address bus 176. ROM 154 contains the basic operating system for the computer system 150. CPU 152 is also connected to RAM 156 by busses 172, 174, and 176. Expansion RAM 158 is optionally coupled to RAM 156 for use by CPU 152. CPU 152 is also coupled to the I/O circuitry 160 by data bus 172, control bus 174, and address bus 176 to permit data transfers with peripheral devices.

I/O circuitry 160 typically includes a number of latches, registers and direct memory access (DMA) controllers. The purpose of I/O circuitry 160 is to provide an interface between CPU 152 and such peripheral devices as display assembly 162, input device 164, and mass storage 168.

Display assembly 162 of computer system 150 is an output device coupled to I/0 circuitry 160 by a data bus 178. Display assembly 162 receives data from I/O circuitry 160 via bus 178 and displays that data on a suitable screen.

The screen for display assembly 162 can be a device that uses a cathode-ray tube (CRT), liquid crystal display (LCD), or the like, of the types commercially available from a variety of manufacturers. Input device 164 can be a keyboard, a mouse, a stylus working in cooperation with a position-sensing display, or the like. The aforementioned input devices are available from a variety of vendors and are well known in the art.

Some type of mass storage 168 is generally considered desirable. However, mass storage 168 can be eliminated by providing a sufficient mount of RAM 156 and expansion RAM 158 to store user application programs and data. In that case, RAMs 156 and 158 can optionally be provided with a backup battery to prevent the loss of data even when computer system 150 is turned off. However, it is generally desirable to have some type of long term mass storage 168 such as a commercially available hard disk drive, nonvolatile memory such as flash memory, battery backed RAM, PC-data cards, or the like.

A removable storage read/write device 169 may be coupled to I/O circuitry 160 to read from and to write to a removable storage media 171. Removable storage media 171 may represent, for example, a magnetic disk, a magnetic tape, an opto-magnetic disk, an optical disk, or the like. Instructions for implementing the inventive method may be provided, in one embodiment, to a network via such a removable storage media.

In operation, information is input into the computer system 150 by typing on a keyboard, manipulating a mouse or trackball, or "writing" on a tablet or on position-sensing screen of display assembly 162. CPU 152 then processes the data under control of an operating system and an application program, such as a program to perform the steps of the inventive method described above, stored in ROM 154 and/or RAM 156. It is noted that such process steps may initially be stored in mass storage 168, downloaded into RAM 156 and then executed out of RAM 156. CPU 152 then typically produces data which is output to the display assembly 162 to produce appropriate images on its screen.

Expansion bus 166 is coupled to data bus 172, control bus 174, and address bus 176. Expansion bus 166 provides extra ports to couple devices such as network interface circuits, modems, display switches, microphones, speakers, etc. to CPU 152. Network communication is accomplished through the network interface circuit and an appropriate network.

Suitable computers for use in implementing the present invention may be obtained from various vendors. Various computers, however, may be used depending upon the size and complexity of the tasks. Suitable computers include mainframe computers, multiprocessor computers, workstations or personal computers. In addition, although a general purpose computer system has been described above, a special-purpose computer may also be used.

It should be understood that the present invention also relates to machine readable media on which are stored program instructions for performing the methods of this invention. Such media include, by way of example, magnetic disks, magnetic tape, optically readable media such as CD ROMs, semiconductor memory such as PCMCIA cards, etc. In each case, the medium may take the form of a portable item such as a small disk, diskette, cassette, etc., or it may take the form of a relatively larger or immobile item such as a hard disk drive or RAM provided in a computer.

CONCLUSION

Although the present invention has been described in detail with regard to the exemplary embodiments and drawings thereof, it should be apparent to those skilled in the art that various adaptations and modifications of the present invention may be accomplished without departing from the spirit and the scope of the invention. Accordingly, the invention is not limited to the precise embodiments shown in the drawings and described in detail above. Rather, it is intended that all such variations not departing from the spirit of the invention be considered as within the scope thereof as limited solely by the claims appended hereto.

What is claimed is:

1. A method for predicting delay of a circuit, said method comprising:
   (a) specifying blocks, each of the blocks comprising a portion of the circuit;
   (b) defining delay calculation collars (DCCs) for the blocks, wherein the DCCs include complete dependency information required to calculate delay within the blocks;
   (c) calculating delay for the blocks based on the DCCs for the blocks;
   (d) calculating delay for the circuit based on the DCCs for the blocks;
   (e) modifying the DCCs for the blocks as necessary based on results of at least one of step (c) and step (d); and
   (f) repeating steps (c) through (e),
wherein steps (c) through (e) are repeated a predetermined number of times.

2. A method according to claim 1, wherein in step (b) default values are used for any information not fully known.

3. A method according to claim 2, wherein in step (e) at least some of the default values are replaced with values calculated in step (c).

4. A method according to claim 1, wherein steps (c) through (e) are repeated until no DCC changes.

5. A method according to claim 1, wherein the DCCs for the blocks include an outside DCC for each block, and wherein the outside DCC for said each block includes complete information regarding circuitry outside of said each block to calculate delay within said each block.

6. A method according to claim 5, wherein at each iteration of step (f) the delay for each block is recalculated in step (c) only if the outside DCC for said each block has changed.

7. A method according to claim 5, wherein the outside DCC for each block consists essentially of a set of minimal information necessary to calculate delay within said each block.

8. A method according to claim 7, wherein the outside DCC for each block consists essentially of: resistance-capacitance (RC) topology information for all wiring outside of said each block leading to all input pins of said each block (input wiring), identification of all gates driving said input wiring (input-driving gates), ramp times of all signals input to said input-driving gates, topology information for all wiring outside of said each block leading from all output pins of said each block (output wiring), and identification of all gates loading said output wiring.

9. A method according to claim 5, wherein the outside DCCs for plural blocks are defined in parallel in step (b).

10. A method according to claim 1, wherein steps (c) through (e) are repeated until a predetermined criterion is satisfied.

11. A method according to claim 1, wherein delay is calculated for plural blocks in parallel in step (c).

12. A method according to claim 1, wherein the DCCs for the blocks include an inside DCC for each block, and wherein the inside DCC for said each block includes complete information to calculate delay for other portions of the circuit that are connected to said each block.

13. A method according to claim 12, wherein delay for the circuit is calculated in step (d) based on the inside DCCs for the blocks.

14. A method according to claim 12, wherein step (d) is repeated pursuant to step (f) only if at least one inside DCC has changed from an immediately previous iteration.

15. A method according to claim 12, wherein the inside DCC for each block consists essentially of a minimal set of information necessary to calculate delay for other portions of the circuit that are connected to said each block.

16. A method according to claim 15, wherein the inside DCC for each block consists essentially of: resistance-capacitance (RC) topology information for all wiring inside said each block leading from all input pins of said each block (input wiring), identification of all gates to which said input wiring is connected (input-loading gates), topology information for all wiring inside said each block leading to all output pins of said each block (output wiring), identification of all gates driving said output wiring (output-driving gates), and ramp times of all signals driving said output-driving gates.

17. A method according to claim 1, wherein the blocks are specified in step (a) so as to avoid inter-block combinational loops.

18. A computer-readable medium storing computer-executable process steps for predicting delay of a circuit, said process steps comprising steps to:

(a) specify blocks, each of the blocks comprising a portion of the circuit;

(b) define delay calculation collars (DCCs) for the blocks, wherein the DCCs include complete dependency information required to calculate delay within the blocks;

(c) calculate delay for the blocks based on the DCCs for the blocks;

(d) calculate delay for the circuit based on the DCCs for the blocks;

(e) modify the DCCs for the blocks as necessary based on results of at least one of step (c) and step (d); and (f) repeat steps (c) through (e), wherein steps (c) through (e) are repeated a predetermined number of times.

19. A computer-readable medium according to claim 18, wherein in step (b) default values are used for any information not fully known.

20. A computer-readable medium according to claim 19, wherein in step (e) at least some of the default values are replaced with values calculated in step (c).

21. A computer-readable medium according to claim 18, wherein steps (c) through (e) are repeated until no DCC changes.

* * * * *